United States Patent
Miura et al.

(10) Patent No.: US 12,330,981 B2
(45) Date of Patent: Jun. 17, 2025

(54) POLYIMIDE PRECURSOR RESIN COMPOSITION FOR FORMING FLEXIBLE DEVICE SUBSTRATE

(71) Applicant: UBE Corporation, Ube (JP)

(72) Inventors: Norio Miura, Ube (JP); Kazutaka Narita, Ube (JP); Takeshige Nakayama, Ube (JP)

(73) Assignee: UBE Corporation, Ube (JP)

( * ) Notice: Subject to any disclaimer, the term of this patent is extended or adjusted under 35 U.S.C. 154(b) by 1206 days.

(21) Appl. No.: 16/957,326

(22) PCT Filed: Dec. 27, 2018

(86) PCT No.: PCT/JP2018/048158
§ 371 (c)(1),
(2) Date: Sep. 14, 2020

(87) PCT Pub. No.: WO2019/131884
PCT Pub. Date: Jul. 4, 2019

(65) Prior Publication Data
US 2020/0407593 A1 Dec. 31, 2020

(30) Foreign Application Priority Data

Dec. 28, 2017 (JP) ................................. 2017-254339

(51) Int. Cl.
| | |
|---|---|
| C03C 17/32 | (2006.01) |
| B05D 1/00 | (2006.01) |
| B05D 3/02 | (2006.01) |
| B32B 9/00 | (2006.01) |
| B32B 17/10 | (2006.01) |
| C03C 17/42 | (2006.01) |
| C08G 73/10 | (2006.01) |
| C08G 73/12 | (2006.01) |
| C08J 5/18 | (2006.01) |
| C09D 179/08 | (2006.01) |
| C23C 16/40 | (2006.01) |
| G02F 1/1333 | (2006.01) |
| G02F 1/1368 | (2006.01) |
| G09F 9/30 | (2006.01) |
| H10D 30/67 | (2025.01) |
| H10D 86/40 | (2025.01) |
| H10D 86/60 | (2025.01) |

(52) U.S. Cl.
CPC .............. *C03C 17/32* (2013.01); *B32B 17/10* (2013.01); *C03C 17/42* (2013.01); *C08G 73/1028* (2013.01); *C08G 73/1067* (2013.01); *C08G 73/1071* (2013.01); *C08G 73/121* (2013.01); *C08G 73/128* (2013.01); *C09D 179/08* (2013.01); *C09D 179/085* (2013.01); *C23C 16/401* (2013.01); *G02F 1/133305* (2013.01); *H10D 30/6746* (2025.01); *H10D 86/411* (2025.01); *H10D 86/421* (2025.01); *H10D 86/60* (2025.01); *C03C 2218/116* (2013.01); *C03C 2218/152* (2013.01); *G02F 1/1368* (2013.01)

(58) Field of Classification Search
None
See application file for complete search history.

(56) References Cited

U.S. PATENT DOCUMENTS

| | | | |
|---|---|---|---|
| 2006/0210819 A1 | 9/2006 | Dueber | |
| 2007/0100127 A1 | 5/2007 | Ishiwata et al. | |
| 2009/0252957 A1 | 10/2009 | Kasumi et al. | |
| 2010/0233488 A1* | 9/2010 | Sonobe ............... | C08G 73/1014 399/329 |
| 2014/0042662 A1 | 2/2014 | Tamada et al. | |
| 2016/0002407 A1* | 1/2016 | Wakita ............... | C08G 73/1039 528/188 |
| 2017/0233530 A1 | 8/2017 | Akinaga et al. | |
| 2020/0317915 A1* | 10/2020 | Ebara ....................... | C09D 5/20 |

FOREIGN PATENT DOCUMENTS

| | | | |
|---|---|---|---|
| CN | 105153445 A | * | 12/2015 |
| EP | 3 467 040 A1 | | 4/2019 |
| JP | H9-077870 A | | 3/1997 |
| JP | 2006/259700 A | | 9/2006 |
| JP | 2006 291003 A | | 10/2006 |
| JP | 2010/215709 A | | 9/2010 |

(Continued)

OTHER PUBLICATIONS

International Search Report and Written Opinion in PCT Application No. PCT/JP2018/048158, mailed Jun. 30, 2020.

*Primary Examiner* — Ha S Nguyen
(74) *Attorney, Agent, or Firm* — Knobbe, Martens, Olson & Bear, LLP

(57) ABSTRACT

A polyimide precursor resin composition for forming a flexible device substrate, including a polyamic acid having a structure obtained from a tetracarboxylic acid component including at least one of 3,3',4,4'-biphenyltetracarboxylic dianhydride and pyromellitic dianhydride, a diamine component including at least one of paraphenylene diamine and 4,4'-diaminodiphenyl ether, and a carboxylic acid monoanhydride, the polyamic acid satisfying equations (1) and (2) below:

$$0.97 \leq X/Y < 1.00 \quad \text{Equation (1)}$$

$$0.5 \leq (Z/2)/(Y-X) \leq 1.05 \quad \text{Equation (2)}$$

in which X represents a number of moles of tetracarboxylic acid component, Y represents a number of moles of diamine component, and Z represents a number of moles of the carboxylic acid monoanhydride.

8 Claims, No Drawings

(56) References Cited

FOREIGN PATENT DOCUMENTS

| | | | |
|---|---|---|---|
| JP | 4853534 B2 | 1/2012 | |
| JP | 5650458 B2 | 1/2015 | |
| JP | 5862866 B2 | 2/2016 | |
| JP | 2017061093 A * | 3/2017 | |
| JP | 2017 073348 A | 4/2017 | |
| JP | 6206446 B2 | 10/2017 | |
| WO | WO 2004/031270 A1 | 4/2004 | |
| WO | WO 2008/004496 A1 | 1/2008 | |
| WO | WO 2013/125194 A1 | 8/2013 | |
| WO | WO-2014207963 A1 * | 12/2014 | ....... B29D 11/00634 |
| WO | WO 2016/024457 A1 | 2/2016 | |
| WO | WO 2016/043180 A1 | 3/2016 | |
| WO | WO 2017/204186 A1 | 11/2017 | |

* cited by examiner

POLYIMIDE PRECURSOR RESIN COMPOSITION FOR FORMING FLEXIBLE DEVICE SUBSTRATE

This application is the U.S. National Phase under 35 U.S.C. § 371 of International Application PCT/JP2018/048158, filed Dec. 27, 2018, designating the U.S., and published in Japanese as WO 2019/131884 on Jul. 4, 2019 which claims priority to Japanese Patent Application No. 2017-254339, filed Dec. 28, 2017, the entire content of which is incorporated herein by reference.

TECHNICAL FIELD

The present invention relates to a polyimide precursor resin composition for forming a flexible device substrate, a laminate and a flexible device using the same, and a method for producing a laminate.

BACKGROUND ART

Conventionally, glass substrates have been used for electronic devices such as flat panel displays using liquid crystal display elements and organic EL display elements. However, there is a problem that glass is fragile due to insufficient strength when it is made thin to reduce its weight. As a substitute for the glass substrate, a lightweight and highly flexible plastic substrate has been developed, and it is expected that the flexible device using the plastic substrate will become widely used in various applications. Polyimide, which is a resin material useful to reduce weight and thickness easily, is suitable for a plastic substrate, and various polyimides have been proposed.

In a manufacturing of a general flexible device, a polyimide film is formed first on a carrier substrate such as glass to prepare a flexible device substrate. In some cases, on the polyimide film, a barrier layer and a polyimide film are further formed to produce a flexible device substrate. A semiconductor element such as a TFT is formed on the flexible device substrate thus obtained. In such a process, the polyimide film is required to be firmly laminated on the carrier substrate or the barrier layer. Further, the polyimide film is also required to have high heat resistance capable of withstanding high temperature conditions during device manufacturing.

Patent Documents 1 and 2 propose a method for manufacturing a laminate of a polyimide film and a carrier substrate. Patent Documents 3 and 4 propose a polyimide precursor to which an alkoxysilane compound has been added or reacted in order to improve the adhesion between the support and the polyimide film. Patent Document 5 proposes a technique of treating a carrier substrate with a silane coupling agent.

On the other hand, there is known a method of improving the properties of polyimide by modifying the polyimide. Patent Document 6 proposes a polyamic acid whose terminal is modified with an acid monoanhydride. Patent Document 7 proposes a polyamic acid whose terminal is modified with an aromatic dicarboxylic acid anhydride.

CITATION LIST

Patent Document

Patent Document 1: U.S. Pat. No. 5,650,458
Patent Document 2: U.S. Pat. No. 6,206,446
Patent Document 3: WO 2013/125194
Patent Document 4: WO 2016/024457
Patent Document 5: U.S. Pat. No. 5,862,866
Patent Document 6: U.S. Pat. No. 4,853,534
Patent Document 7: WO 2017/204186

SUMMARY OF THE INVENTION

Technical Problem

The polyimide films described in Patent Documents 1 and 2 have low adhesion to a carrier substrate and have a problem of peeling. The polyimide precursor solutions described in Patent Documents 3 to 5 lack stability, and the resulting polyimide film does not have adhesiveness that can withstand high temperature conditions during device manufacture, and the reliability of flexible devices is impaired.

The polyamic acid described in Patent Document 6 has improved viscosity stability and, when imidized, mechanical strength and toughness, but the peel strength is not improved. The polyimide film described in Patent Document 7 is used not as a flexible device substrate but as a release layer for a glass substrate. As a matter of course, the required physical properties and their standards are greatly different between the flexible device substrate and the release layer.

The polyimide film used for the flexible device substrate is required to have improved peel strength from the carrier substrate. An object of the present invention is to provide a polyimide precursor resin composition for forming a flexible device substrate, which is capable of providing a polyimide film having high peel strength with respect to a substrate while ensuring mechanical properties required for flexible device applications.

The present invention relates to the following items.

1. A polyimide precursor resin composition for forming a flexible device substrate, comprising a polyamic acid having a structure obtained from:
   a tetracarboxylic acid component comprising at least one of 3,3',4,4'-biphenyltetracarboxylic dianhydride and pyromellitic dianhydride,
   a diamine component comprising at least one of paraphenylene diamine and 4,4'-diaminodiphenyl ether, and
   a carboxylic acid monoanhydride,
wherein the polyamic acid satisfies following equations (1) and (2):

$$0.97 \leq X/Y < 1.00 \quad \text{Equation (1)}$$

$$0.5 \leq (Z/2)/(Y-X) \leq 1.05 \quad \text{Equation (2)}$$

wherein X represents a number of moles of tetracarboxylic acid component, Y represents a number of moles of diamine component, and Z represents a number of moles of the carboxylic acid monoanhydride.

2. The polyimide precursor resin composition for forming a flexible device substrate according to the Item 1, wherein a content of 3,3',4,4'-biphenyltetracarboxylic dianhydride is 40 mol % or more in the tetracarboxylic acid component.

3. The polyimide precursor resin composition for forming a flexible device substrate according to the Item 1 or 2, wherein a content of paraphenylenediamine is 40 mol % or more in the diamine component.

4. The polyimide precursor resin composition for forming a flexible device substrate according to any one of the Items 1 to 3, wherein the carboxylic acid monoanhydride is phthalic anhydride or maleic anhydride.

5. A laminate comprising a polyimide film obtained from the polyimide precursor resin composition for forming a flexible device substrate according to any one of the Items 1 to 4, and a glass substrate.

6. A flexible device substrate comprising a polyimide film obtained from the polyimide precursor resin composition for forming a flexible device substrate according to any one of the Items 1 to 4.

7. A flexible device substrate comprising:
- a polyimide film obtained from the polyimide precursor resin composition for forming a flexible device substrate according to any one of the Items 1 to 4, and
- an inorganic film comprising an inorganic material selected from the group consisting of silicon nitride, silicon oxide, silicon oxynitride, aluminum oxide, titanium oxide, and zirconium oxide.

8. A flexible device comprising the flexible device substrate according to the Item 6 or 7, and a TFT mounted thereon.

9. A method for producing a laminate, comprising steps of casting a polyimide precursor resin composition for forming a flexible device substrate comprising a polyamic acid on a substrate, and imidizing the polyamic acid by heat treatment to form a polyimide film, wherein
the polyamic acid have a structure obtained from a tetracarboxylic acid component comprising at least one of 3,3',4,4'-biphenyltetracarboxylic dianhydride and pyromellitic dianhydride; a diamine component comprising at least one of paraphenylenediamine and 4,4'-diaminodiphenyl ether; and a carboxylic acid monoanhydride; wherein the polyamic acid satisfies following equations (1) and (2):

$$0.97 \leq X/Y < 1.00 \quad \text{Equation (1)}$$

$$0.5 \leq (Z/2)/(Y-X) \leq 1.05 \quad \text{Equation (2)}$$

wherein X represents a number of moles of tetracarboxylic acid component, Y represents a number of moles of diamine component, and Z represents a number of moles of the carboxylic acid monoanhydride.

Effect of the Invention

According to the present invention, provided is a polyimide precursor resin composition for forming a flexible device substrate which is capable of providing a polyimide film having high peeling strength with respect to a substrate while ensuring mechanical properties required for a flexible device applications. The polyimide film obtained from the polyimide precursor resin composition for forming a flexible device substrate of the present invention can be suitably used for a flexible device substrate. Furthermore, the polyimide precursor resin composition for forming a flexible device substrate of the present invention has improved viscosity stability, and therefore the reliability of the flexible device can be improved.

The polyamic acid has a structure obtained from a tetracarboxylic acid component containing at least one of 3,3',4,4'-biphenyltetracarboxylic dianhydride and pyromellitic dianhydride, a diamine component containing at least one of paraphenylenediamine and 4,4'-diaminodiphenyl ether, and a carboxylic acid monoanhydride. The main chain of the polyamic acid having this structure comprises a polymer of a tetracarboxylic acid component containing at least one of 3,3',4,4'-biphenyltetracarboxylic dianhydride and pyromellitic dianhydride, and a diamine component containing at least one of paraphenylenediamine and 4,4'-diaminodiphenyl ether, and in at least a part of the polyamic acid, the end of the main chain is capped with a carboxylic acid monoanhydride.

From the viewpoint of heat resistance, dimensional change ratio, and viscosity stability of polyamic acid, the amount of 3,3',4,4'-biphenyltetracarboxylic dianhydride in the tetracarboxylic acid component is preferably 40 mol % or more, more preferably 60 mol % or more, and further preferably 80 mol % or more, and it may even be 100 mol %. The amount of pyromellitic dianhydride in the tetracarboxylic acid component is preferably 5 mol % or more, more preferably 10 mol % or more. The amount of pyromellitic dianhydride in the tetracarboxylic acid component is preferably 40 mol % or less, more preferably 20 mol % or less. The total amount of 3,3',4,4'-biphenyltetracarboxylic dianhydride and pyromellitic dianhydride in the tetracarboxylic acid component is preferably 40 mol % or more, more preferably 60 mol % or more, and more preferably 80 mol % or more, and it may be 100 mol %.

From the viewpoint of heat resistance and dimensional change ratio, the amount of paraphenylenediamine in the diamine component is preferably 40 mol % or more, more preferably 60 mol % or more, and further preferably 80 mol % or more, and it may even be 100 mol %. The amount of 4,4'-diaminodiphenyl ether in the diamine component is preferably 5 mol % or more, more preferably 10 mol % or more. The amount of 4,4'-diaminodiphenyl ether in the diamine component is preferably 60 mol % or less, more preferably 40 mol % or less, and particularly preferably 20 mol % or less. In one embodiment, the diamine component may consist of para-phenylenediamine and/or 4,4'-diaminodiphenyl ether. The total amount of paraphenylenediamine and 4,4'-diaminodiphenyl ether in the diamine component is preferably 40 mol % or more, more preferably 60 mol % or more, and further preferably 80 mol % or more, and it may even be 100 mol %.

Further, other tetracarboxylic dianhydrides and diamines can be used as long as the characteristics of the present invention are not impaired.

The additional tetracarboxylic acid dianhydride is not particularly limited, but from the view point of the characteristics of the obtained polyimide, aromatic tetracarboxylic acid dianhydride and alicyclic tetracarboxylic acid dianhydride are preferable. For example, suitable examples include 2,3,3',4'-biphenyltetracarboxylic dianhydride, 2,2',3,3'-biphenyltetracarboxylic dianhydride, 3,3',4,4'-benzophenonetetracarboxylic dianhydride, oxydiphthalic dianhydride, diphenylsulfone tetracarboxylic dianhydride, p-terphenyl tetracarboxylic dianhydride, m-terphenyl tetracarboxylic dianhydride, cyclobutane-1,2,3,4-tetracarboxylic dianhydride and 1,2,4,5-cyclohexanetetracarboxylic dianhydride. The above-mentioned tetracarboxylic acid dianhydride does not have to be one kind, and may be a mixture of plural kinds.

The additional diamine includes, but not particularly limited, aromatic diamines such as 4,4'-diaminodiphenylmethane, m-phenylenediamine, 2,4-diaminotoluene, 1,3-bis(4-aminophenoxy)benzene, 1,4-bis(4-aminophenoxy)benzene, 2,2-bis[4-(4-aminophenoxy)phenyl]propane, m-xylylenediamine, p-xylylenediamine, 2,2-bis[4-(4-aminophenoxy)phenyl]propane, 4,4'-methylenebis(2,6-xylidine), and α,α'-bis(4-aminophenyl)-1,4-diisopropylbenzene; and aliphatic diamines such as hexamethylenediamine, heptamethylenediamine, octamethylenediamine, nonamethylenediamine, decamethylenediamine, diaminopropyltetramethylene, 3-methylheptamethylenediamine, 2, 11-diaminododecane, and 1,12-diaminooctadecane. The above-mentioned diamine does not have to be one kind, and may be a mixture of plural kinds.

The carboxylic acid monoanhydride is used for capping the end of a polyamic acid obtained by the reaction of a tetracarboxylic acid component and a diamine component.

The polyimide film end-capped with a carboxylic acid monoanhydride has excellent adhesiveness to carrier substrates or barrier layers. Further, when a polyimide film end-capped with a carboxylic acid monoanhydride is used for a flexible device substrate, the reliability and electric characteristics of the produced flexible device may be improved in some cases. The carboxylic acid monoanhydride is not particularly limited, and may be an aromatic carboxylic acid monoanhydride or an aliphatic carboxylic acid monoanhydride. Particularly, aromatic carboxylic acid monoanhydride is preferable. Further, in a specific use, it is preferable that the carboxylic acid monoanhydride does not contain other functional groups such as a hydroxyl group, a carbonyl group, a carboxyl group, and an amino group, and for example, a dicarboxylic acid monoanhydride is preferable. The aromatic carboxylic acid monoanhydride preferably has an aromatic ring having 6 to 30 carbon atoms, more preferably has an aromatic ring having 6 to 15 carbon atoms, and further preferably has an aromatic ring having 6 to 10 carbon atoms.

Examples of the carboxylic acid monoanhydride include aromatic carboxylic acid monoanhydrides such as phthalic anhydride, 2,3-benzophenone dicarboxylic anhydride, 3,4-benzophenone dicarboxylic anhydride, 1,2-naphthalenedicarboxylic anhydride and 2,3-naphthalenedicarboxylic anhydride, 1,8-naphthalenedicarboxylic anhydride, 1,2-anthracene dicarboxylic anhydride, 2,3-anthracene dicarboxylic anhydride, 1,9-anthracene dicarboxylic anhydride, trimellitic anhydride; and alicyclic carboxylic acid monoanhydrides such as maleic anhydride, succinic anhydride, tetrahydrophthalic anhydride, hexahydrophthalic anhydride, and itaconic anhydride. Among these, phthalic anhydride is preferable. The carboxylic acid monoanhydride may also be a carboxylic acid monoanhydride having an ethynyl group such as phenylethynylphthalic anhydride. Carboxylic acid monoanhydrides having an ethynyl group are preferred for specific applications. On the other hand, the heat resistance of the polyimide may decrease due to the ethynyl group in some cases, and it is preferable that the carboxylic acid monoanhydride having an ethynyl group is not contained in a specific application.

The molar ratios of the tetracarboxylic acid component, the diamine component, and the carboxylic acid monoanhydride satisfy the following equations (1) and (2):

$$0.97 \leq X/Y < 1.00 \quad \text{Equation (1)}$$

$$0.5 \leq (Z/2)/(Y-X) \leq 1.05 \quad \text{Equation (2)}$$

wherein X represents a number of moles of tetracarboxylic acid component, Y represents a number of moles of diamine component, and Z represents a number of moles of the carboxylic acid monoanhydride.

When X/Y is 0.97 or more, the molecular weight of the polyamic acid is increased, and the strength and heat resistance of the obtained polyimide film are improved. X/Y is preferably 0.98 or more. When X/Y is less than 1.00, the diamine component becomes excessive with respect to the tetracarboxylic acid component. By doing so, amino groups are formed that are capable of end-capping with a carboxylic acid monoanhydride. X/Y is preferably 0.99 or less.

Further, (Z/2)/(Y-X) represents the molar ratio of the carboxylic acid monoanhydride and the amino group capable of end-capping. When X/Y is less than 1.00 and (Z/2)/(Y-X) is 0.5 or more, the end-capping ratio of the polyamic acid can be increased, and the adhesive strength of the resulting polyimide film can be improved. The closer (Z/2)/(Y-X) is to 1, the more preferable. (Z/2)/(Y-X) is preferably 0.6 or more, more preferably 0.7 or more. When (Z/2)/(Y-X) is 1.05 or less, the amount of free carboxylic acid monoanhydride can be reduced and the strength of the obtained polyimide film can be increased. (Z/2)/(Y-X) is preferably 1.03 or less, more preferably 1.01 or less.

As described above, by satisfying the above equations (1) and (2), it is possible to obtain a polyimide film that exhibits high peel strength with respect to a substrate without impairing the mechanical properties required for flexible device applications.

In the present invention, the inherent viscosity of the polyamic acid is not particularly limited, but it is preferred that the inherent viscosity in an N-methyl-2-pyrrolidone solution having a concentration of 0.5 g/dL at 30° C. is 0.2 dL/g or more, preferably 0.4 dL/g or more. When the inherent viscosity is 0.2 dL/g or more, the molecular weight of the polyamic acid is high, and the resulting polyimide has excellent mechanical strength and heat resistance. The inherent viscosity in N-methyl-2-pyrrolidone solution having a concentration of 0.5 g/dL at 30° C. is generally 4.0 dL/g or less.

If necessary, an imidization catalyst, an organic phosphorus-containing compound, inorganic fine particles, and the like may be added to the polyimide precursor resin composition.

Examples of the imidization catalyst include a substituted or unsubstituted nitrogen-containing heterocyclic compound, an N-oxide compound of the nitrogen-containing heterocyclic compound, a substituted or unsubstituted amino acid compound, an aromatic hydrocarbon compound having a hydroxyl group, or an aromatic heterocyclic compound. In particular, preferably used compounds include lower alkyl imidazoles such as 1,2-dimethylimidazole, N-methylimidazole, N-benzyl-2-methylimidazole, 2-methylimidazole, 2-ethyl-4-methylimidazole, and 5-methylbenzimidazole; benzimidazoles such as N-benzyl-2-methylimidazole; and substituted pyridines such as, isoquinoline, 3,5-dimethylpyridine, 3,4-dimethylpyridine, 2,5-dimethylpyridine, 2,4-dimethylpyridine, and 4-n-propylpyridine. The amount of the imidization catalyst used is preferably 0.01 to 2 times equivalent, and more preferably 0.02 to 1 times equivalent to the amide acid unit of the polyamic acid. The use of the imidization catalyst may improve the physical properties of the obtained polyimide film, particularly the elongation and the end-cleave resistance.

Examples of the organic phosphorus-containing compound include phosphoric acid esters such as monocaproyl phosphate, monooctyl phosphate, monolauryl phosphate, monomyristyl phosphate, monocetyl phosphate, monostearyl phosphate, phosphate monoester of triethylene glycol monotridecyl ether, phosphate monoester of tetraethylene glycol monolauryl ether, phosphate monoester of diethylene glycol monostearyl ether, dicaproyl phosphate, dioctyl phosphate, dicapryl phosphate, dilauryl phosphate, dimyristyl phosphate, dicetyl phosphate, distearyl phosphate, phosphate diester of tetraethylene glycol mononeopentyl ether, phosphate diester of triethylene glycol monotridecyl ether, phosphate diester of tetraethylene glycol monolauryl ether, phosphate diester of diethylene glycol monostearyl ether; and amine salts of these phosphoric acid esters. Examples of the amine include ammonia, monomethylamine, monoethylamine, monopropylamine, monobutylamine, dimethylamine, diethylamine, dipropylamine, dibutylamine, trimethylamine, triethylamine, tripropylamine, tributylamine, monoethanolamine, diethanolamine, triethanolamine, and the like.

Examples of the inorganic fine particles include inorganic oxide powders in a fine particle form such as titanium dioxide powder, silicon dioxide (silica) powder, magnesium oxide powder, aluminum oxide (alumina) powder, and zinc oxide powder; inorganic nitride powders in a fine particle form such as silicon nitride powder, and titanium nitride powder; inorganic carbide powders such as silicon carbide powders; and inorganic salt powders in a fine particle form such as calcium carbonate powders, calcium sulfate powders, and barium sulfate powders. These inorganic fine particles may be used in combination of 2 or more types. In order to uniformly disperse these inorganic fine particles, means which are known per se can be used.

In one embodiment, the polyimide precursor resin composition preferably does not contain a silane coupling agent such as alkoxysilane. In a polyimide film using a silane coupling agent, the silane coupling agent may bleed out. This causes problems such as a decrease in adhesive strength of the polyimide film, swelling of the laminate, and a decrease in reliability of the semiconductor element. Furthermore, when a silane coupling agent is added to or reacted with the polyamic acid solution, there is a problem that the viscosity stability of the polyamic acid solution decreases. In order to avoid such problems, it is preferable not to use a silane coupling agent. The polyimide film obtained from the polyimide precursor resin composition of the present invention has improved peel strength with respect to the substrate, and therefore, a good flexible device substrate can be provided even if a silane coupling agent is not used.

The polyimide precursor resin composition of the present invention may comprise a solvent. The solvent is not particularly limited as long as it can dissolve the polyamic acid, and the same solvent as that used when preparing the polyamic acid can be used. The solvent may be a mixture of two or more kinds.

The solvent used when preparing the polyamic acid is not particularly limited, and examples thereof include amide solvents such as N,N-dimethylformamide, N, N-dimethylacetamide, N, N-diethylacetamide, N-methyl-2-pyrrolidone and N-ethyl-2-pyrrolidone and N-vinyl-2-pyrrolidone; cyclic ester solvents such as γ-butyrolactone, γ-valerolactone, δ-valerolactone, γ-caprolactone, ε-caprolactone and α-methyl-γ-butyrolactone; carbonate solvents such as ethylene carbonate and propylene carbonate; glycol-based solvents such as triethylene glycol; phenol-based solvent such as m-cresol, p-cresol, 3-chlorophenol and 4-chlorophenol; acetophenone, 1,3-dimethyl-2-imidazolidinone, sulfolane, dimethyl sulfoxide and the like. Further, other general organic solvents, for example, alcohol solvents such as methanol and ethanol, phenol, o-cresol, butyl acetate, ethyl acetate, isobutyl acetate, propylene glycol methyl acetate, ethyl cellosolve, butyl cellosolve, 2-methyl cellosolve acetate, ethyl cellosolve acetate, butyl cellosolve acetate, tetrahydrofuran, dimethoxyethane, diethoxyethane, dibutyl ether, diethylene glycol dimethyl ether, methyl isobutyl ketone, diisobutyl ketone, cyclopentanone, cyclohexanone, methyl ethyl ketone, acetone, butanol, ethanol, xylene, toluene, chlorobenzene, N-methylcaprolactam, hexamethylphosphorotriamide, bis(2-methoxyethyl)ether, 1,2-bis(2-methoxyethoxy)ethane, bis[2-(2-methoxyethoxy)ethyl] ether, 1,4-dioxane, dimethyl sulfoxide, dimethyl sulfone, diphenyl ether, diphenyl sulfone, tetramethyl urea, anisole, terpene, mineral spirits, petroleum naphtha solvent, biodegradable methyl lactate, ethyl lactate, butyl lactate, and the like. The organic solvent used herein may be one kind or two or more kinds.

In the polyimide precursor resin composition of the present invention, the solid content concentration attributed to the polyamic acid is not particularly limited, but is preferably 5% by mass to 45% by mass, more preferably 7% by mass to 40% by mass, and further preferably 9% by mass to 30% by mass based on the total amount of the polyamic acid and the solvent. If the solid content concentration is lower than 5% by mass, the productivity and handling during use may be poor, and if it is higher than 45% by mass, the fluidity of the solution may be lost.

The solution viscosity of the polyimide precursor resin composition of the present invention at 30° C. is, but not particularly limited, preferably 1000 Pa·s or less, more preferably 0.1 to 500 Pa·s, and further preferably 0.1 to 300 Pa·s, particularly preferably 0.1 to 200 Pa·s, from the view point of handling. If the solution viscosity exceeds 1000 Pa·s, the fluidity may be lost and uniform coating on a carrier substrate such as metal or glass may become difficult. If the solution viscosity is lower than 0.1 Pa·s, dripping or cissing may easily occur during application onto a carrier substrate of, for example, metal or glass, and it may be difficult to obtain a polyimide film having excellent properties.

The polyimide precursor resin composition of the present invention is excellent in storage stability because the terminal is capped with carboxylic acid monoanhydride. The viscosity-change ratio of the polyimide precursor resin composition of the present invention is preferably ±10% or less, more preferably ±5% or less, still more preferably ±3% or less. If the viscosity-change ratio is within this range, the change in viscosity even after long-term storage is small, which enables to suppress the occurrence of unevenness when coated on various substrates. Here, the "viscosity-change ratio" means a change in viscosity when the polyimide precursor resin composition is held at 25° C. for 30 days. Specifically, it is determined by the following calculation method using the viscosity of the polyimide precursor resin composition after holding at 25° C. for 30 days (viscosity after holding) and the viscosity of the polyimide precursor resin composition before holding for 30 days at 25° C. (viscosity before holding).

$$(\text{Viscosity–change ratio (\%)}) = \{(\text{viscosity after holding}) - (\text{viscosity before holding})\} / (\text{viscosity before holding}) \times 100$$

The method for producing a polyimide precursor resin composition of the present invention, generally, comprises a first step of obtaining a polyamic acid having amino group (s) at terminal(s) by reacting a tetracarboxylic acid component and a diamine component in a solvent at a molar ratio satisfying the equation (1); and a second step of reacting the obtained polyamic acid with a carboxylic acid monoanhydride at a molar ratio satisfying the equation (2) to end-cap the polyamic acid.

In the first step, in order to suppress the imidization reaction, it is carried out at a relatively low temperature of, for example, 100° C. or lower, preferably 80° C. or lower. Although not limited, the reaction temperature is usually 25° C. to 100° C., preferably 40° C. to 80° C., more preferably 50° C. to 80° C., and the reaction time is usually about 0.1 to 24 hours, preferably about 2 to 12 hours. By setting the reaction temperature and the reaction time within the above ranges, a solution composition of polyamic acid having a high molecular weight can be efficiently obtained. While the reaction can be carried out in an air atmosphere, it is usually carried out in an inert gas atmosphere, preferably a nitrogen gas atmosphere.

In the second step, the reaction temperature may be appropriately set, but from the viewpoint of surely capping the end(s) of the polyamic acid, it is preferably 25° C. to 70° C., more preferably 25° C. to 60° C., sill more preferably 25° C. to 50° C. The reaction time is usually about 0.1 to 24 hours.

A flexible device substrate can be manufactured using the polyimide precursor resin composition of the present invention. Furthermore, a flexible device can be manufactured using the obtained flexible device substrate.

In the production of a flexible device substrate, first, the polyimide precursor resin composition of the present invention is cast on a carrier substrate and imidized by heat treatment to form a polyimide film. The obtained polyimide film can be used for a flexible device substrate. Although the carrier substrate is not limited, a glass substrate such as soda lime glass, borosilicate glass, or non-alkali glass, or a metal substrate such as iron or stainless steel is generally used. The method of casting the polyamic acid solution on the carrier substrate is not particularly limited, and examples thereof include conventionally known methods such as spin coating method, screen printing method, bar coating method, and electrodeposition method. The heat treatment condition is not particularly limited, but it is preferably carried out by drying in the temperature range of 50° C. to 150° C., and then heat-treating with such a condition that the maximum heating temperature is 150° C. to 600° C., preferably 200° C. to 550° C., more preferably 250° C. to 500° C.

The thickness of the polyimide film is preferably 1 μm or more. When the thickness is less than 1 μm, the polyimide film cannot retain sufficient mechanical strength, and when used as a flexible device substrate, it may not be able to withstand stress and may be destroyed. The thickness of the polyimide film is preferably 20 μm or less. If the thickness of the polyimide film exceeds 20 μm, it becomes difficult to reduce the thickness of the flexible device. The thickness of the polyimide film is more preferably 2 to 10 μm in order to make the film thinner while maintaining sufficient resistance as a flexible device.

The polyimide film obtained from the polyimide precursor resin composition of the present invention is firmly laminated on the glass substrate. The peel strength between the glass substrate and the polyimide film is generally 50 mN/mm or more, preferably 100 mN/mm or more, more preferably 200 mN/mm or more, even more preferably 300 mN/mm or more, when measured according to JIS K6854-1.

A flexible device substrate may be formed by laminating a second layer such as a resin film or an inorganic film on the polyimide film obtained from the polyimide precursor resin composition of the present invention. In particular, an inorganic film is suitable because it is used as a water vapor barrier layer. Examples of the water vapor barrier layer include inorganic films containing an inorganic material selected from the group consisting of metal oxides, metal nitrides and metal oxynitrides such as silicon nitride ($SiN_x$), silicon oxide ($SiO_x$), silicon oxynitride ($SiO_xN_y$), aluminum oxide ($Al_2O_3$), titanium oxide ($TiO_2$), and zirconium oxide ($ZrO_2$). Generally, as methods of forming these thin films, physical vapor deposition methods such as vacuum vapor deposition method, sputtering method and ion plating method, and chemical vapor deposition methods such as plasma CVD method and catalytic chemical vapor deposition (Cat-CVD) method and the like are known.

A flexible device substrate may be formed by laminating a polyimide film obtained from the polyimide precursor resin composition of the present invention on a resin film or an inorganic film. A polyimide film may be laminated on a resin film or an inorganic film by using the polyimide precursor resin composition of the present invention in the same manner as in the case of a carrier substrate.

The polyimide film obtained from the polyimide precursor resin composition of the present invention is firmly laminated even when the inorganic film serves as the substrate. The peel strength between the polyimide film and the inorganic film (eg, silicon oxide film) is generally 50 mN/mm or more, preferably 100 mN/mm or more, and more preferably 200 mN/mm or more, yet more preferably 300 mN/mm or more, when measured according to JIS K6854-1.

In manufacturing a flexible device, a circuit required for a display device or a light receiving device is formed on the flexible device substrate (particularly, a polyimide film) formed as described above. This process depends on the type of device. When manufacturing a TFT liquid crystal display device, for example, a TFT of amorphous silicon is formed on a polyimide film. The TFT includes, for example, a gate metal layer, a semiconductor layer such as an amorphous silicon film, a silicon nitride gate dielectric layer, and an ITO pixel electrode. Further, a structure required for a liquid crystal display may be formed thereon by a known method. Since the polyimide film obtained in the present invention is excellent in various characteristics such as heat resistance and toughness, the method for forming a circuit is not particularly limited.

The flexible device substrate (particularly a polyimide film) having a circuit or the like formed on the surface as described above is peeled from the carrier substrate. The peeling method is not particularly limited, and peeling can be performed by irradiating a laser or the like from the carrier substrate side, for example.

Examples of the flexible device in the present invention include display devices such as liquid crystal displays, organic EL displays, and electronic paper, and light receiving devices such as solar cells, and CMOS. The present invention is particularly suitable for application to a device that is desired to be thin and flexible.

EXAMPLE

Hereinafter, the present invention will be described in more detail with reference to examples. The present invention is not limited to the examples below.

The method of measuring the characteristics used in the following examples is shown below.

<Solution Viscosity>

Using an E-type rotational viscometer, the solution viscosity at 25° C. and at 10 rpm was measured.

<Viscosity Stability>

A sample having a viscosity-change ratio of the solution viscosity of ±5% or less after being kept at 25° C. for 30 days was marked with ○ (good), and other samples were marked with x (bad).

<Peeling Strength Between Layers of Laminate (Delamination Strength of Laminate)>

Measurements were carried out by 90° peel test described in JIS K6854-1, with a sample width of 10 mm and a crosshead speed of 50 mm/min.

The abbreviations of the compounds used in the following examples are as follows.

s-BPDA: 3,3',4,4'-bip henyltetracarboxylic dianhydride
PMDA: pyromellitic dianhydride
PPD: p-phenylenediamine
ODA: 4,4'-diaminodiphenyl ether PEPA: 4-phenylethynyl phthalic anhydride
NMP: N-methyl-2-pyrrolidone
γ-APS: 3-aminopropyltriethoxysilane The amounts of compounds used in the examples below are expressed in molar proportions. The total amount of the diamine is 100 mol %, and the amounts of the other compounds are represented by the molar ratio with respect to the total amount of the diamine.

Example 1

PPD (100 mol %) and NMP were charged into a reaction vessel purged with nitrogen gas, and heated and stirred for 15 minutes at 40° C. to dissolve the monomer. Then, s-BPDA (98 mol %) was added, and the mixture was further stirred for 30 minutes to obtain a polyamic acid solution. Then, phthalic anhydride (2 mol %) was added to the polyamic acid solution to obtain a liquid polyimide precursor resin composition having a viscosity of 3.0 Pa·s (25° C.). This polyimide precursor resin composition was allowed to stand at 25° C. for 30 days, and the viscosity stability was evaluated. The evaluation result was ○ (good).

The prepared polyimide precursor resin composition was spin-coated on a glass substrate, and the coated film was heat-treated at 120° C., 150° C., 200° C., 250° C., and 500° C. for 10 minutes at each temperature to form a polyimide film having a thickness of 10 μm. No blistering was observed in the obtained polyimide/glass laminate, and the 90° peel strength between the polyimide film and the glass substrate in the laminate was 538 mN/mm.

Example 2

A SiOx film was formed on the polyimide film of the polyimide/glass laminate obtained in Example 1 by chemical vapor deposition (CVD). The polyimide precursor resin composition obtained in Example 1 was spin-coated on this SiOx film. The coated film was heat-treated at 120° C., 150° C., 200° C., 250° C., and 500° C. for 10 minutes at each temperature, and a polyimide film having a thickness of 10 μm is further formed to form a laminate having two polyimide layers. above was obtained. No blistering was observed in this laminate, and the 90° peel strength between the SiOx layer of this laminate and the polyimide layer laminated thereon was 499 mN/mm.

Example 3

PPD (100 mol %) and NMP were charged into a reaction vessel purged with nitrogen gas, and heated and stirred for 15 minutes at 40° C. to dissolve the monomer. Then, s-BPDA (98 mol %) was added, and the mixture was further stirred for 30 minutes to obtain a polyamic acid solution. Thereafter, phthalic anhydride (4 mol %) was added to the polyamic acid solution to obtain a liquid polyimide precursor resin composition having a viscosity of 2.9 Pa·s (25° C.). This polyimide precursor resin composition was allowed to stand at 25° C. for 30 days, and the viscosity stability was evaluated. The evaluation result was ○ (good).

The prepared polyimide precursor resin composition was spin-coated on a glass substrate, and the coated film was heat-treated at 120° C., 150° C., 200° C., 250° C., and 500° C. for 10 minutes at each temperature to form a polyimide film having a thickness of 10 μm on the glass substrate. No blistering was observed in the obtained polyimide/glass laminate, and the 90° peel strength between the polyimide film and the glass substrate in the laminate was 512 mN/mm.

Example 4

PPD (100 mol %) and NMP were charged into a reaction vessel purged with nitrogen gas, and heated and stirred for 15 minutes at 40° C. to dissolve the monomer. Then, s-BPDA (98 mol %) was added, and the mixture was further stirred for 30 minutes to obtain a polyamic acid solution. Then, maleic anhydride (4 mol %) was added to the polyamic acid solution to obtain a liquid polyimide precursor resin composition having a viscosity of 3.1 Pa·s (25° C.). This polyimide precursor resin composition was allowed to stand at 25° C. for 30 days, and the viscosity stability was evaluated. The evaluation result was ○ (good).

The prepared polyimide precursor resin composition was spin-coated on a glass substrate, and the coated film was heat-treated at 120° C., 150° C., 200° C., 250° C., and 500° C. for 10 minutes at each temperature to form a polyimide film having a thickness of 10 μm on the glass substrate. No blistering was observed in the obtained polyimide/glass laminate, and the 90° peel strength between the polyimide film and the glass substrate in the laminate was 282 mN/mm.

Comparative Example 1

PPD (100 mol %) and NMP were charged into a reaction vessel purged with nitrogen gas, and heated and stirred for 15 minutes at 40° C. to dissolve the monomer. Then, s-BPDA (100 mol %) was added and the mixture was further stirred for 30 minutes to obtain a liquid polyimide precursor resin composition having a viscosity of 1.1 Pa·s (25° C.). This polyimide precursor resin composition was allowed to stand at 25° C. for 30 days, and the viscosity stability was evaluated. The evaluation result was ○ (good).

The obtained liquid polyimide precursor resin composition was spin-coated on a 6-inch silicon substrate having a thickness of 625 μm, followed by baking for 2 minutes on a hot plate at 130° C. to form a film having a thickness of 5 μm. Then, using a curing furnace, it was heated and cured at 200° C. for 30 minutes and further at 350° C. for 60 minutes to imidize and obtain a polyimide film. The film thickness after imidization was 3 μm. No blistering was observed in this laminate, but the 90° peel strength between the polyimide film and the silicon substrate was 10 mN/mm, and almost no adhesion was observed.

Comparative Example 2

PPD (100 mol %) and NMP were charged into a reaction vessel purged with nitrogen gas, and heated and stirred for 15 minutes at 40° C. to dissolve the monomer. Then, s-BPDA (99.5 mol %) and silane coupling agent γ-APS (0.5 mol %) were added, and the mixture was stirred for another 30 minutes to obtain a liquid polyimide precursor resin composition having a viscosity of 19.0 Pa·s (25° C.). This polyimide precursor resin composition was allowed to stand at 25° C. for 30 days, and the viscosity stability was evaluated. The evaluation result was x (bad).

The prepared polyimide precursor resin composition was spin-coated on a glass substrate, and the coated film was heat-treated at 120° C., 150° C., 200° C., 250° C., and 500° C. for 10 minutes at each temperature to form a polyimide film having a thickness of 10 μm on the glass substrate. A SiOx film was formed on the polyimide film of the obtained polyimide/glass laminate by chemical vapor deposition (CVD). The prepared polyimide precursor resin composition was spin-coated on the SiOx film again. The coating film was heat-treated at 120° C., 150° C., 200° C., 250° C. and 500° C. for 10 minutes at each temperature to further form a polyimide film having a thickness of 10 μm, and thus a laminate having two polyimide layers was obtained. No blistering was observed in this laminate, but the 90° peel strength between the SiOx layer and the polyimide layer laminated thereon in the laminate was 4 mN/mm, meaning that they were not adhered practically.

Comparative Example 31

PPD (100 mol %) and NMP were charged into a reaction vessel purged with nitrogen gas, and the mixture was heated and stirred for 15 minutes at 40° C. to dissolve the monomer. Then, s-BPDA (98 mol %) was added, and the mixture was further stirred for 30 minutes to obtain a polyamic acid solution. Thereafter, phthalic anhydride (8 mol %) was added to the polyamic acid solution to obtain a liquid polyimide precursor resin composition having a viscosity of 3.2 Pa·s (25° C.). This polyimide precursor resin composition was allowed to stand at 25° C. for 30 days, and the viscosity stability was evaluated. The evaluation result was ○ (good).

The prepared polyimide precursor resin composition was spin-coated on a glass substrate, and the coated film was heat-treated at 120° C., 150° C., 200° C., 250° C., and 500° C. for 10 minutes at each temperature to form a polyimide film having a thickness of 10 μm on the glass substrate. No blistering was observed in the obtained polyimide/glass laminate, but the 90° peel strength could not be measured because the polyimide film was very fragile.

Comparative Example 4

PPD (100 mol %) and NMP were charged into a reaction vessel purged with nitrogen gas, and heated and stirred for 15 minutes at 40° C. to dissolve the monomer. Then, s-BPDA (97 mol %) was added, and the mixture was further stirred for 30 minutes to obtain a polyamic acid solution. Thereafter, phthalic anhydride (2 mol %) was added to the polyamic acid solution to obtain a liquid polyimide precursor resin composition having a viscosity of 2.8 Pa·s (25° C.). This polyimide precursor resin composition was allowed to stand at 25° C. for 30 days, and the viscosity stability was evaluated. The evaluation result was ○ (good).

The prepared polyimide precursor resin composition was spin-coated on a glass substrate, and the coated film was heat-treated at 120° C., 150° C., 200° C., 250° C., and 500° C. for 10 minutes at each temperature to form a polyimide film having a thickness of 10 μm on the glass substrate. No blistering was observed in the obtained polyimide/glass laminate, but the 90° peel strength could not be measured because the polyimide film was very fragile.

Comparative Example 5

PPD (100 mol %) and NMP were charged into a reaction vessel purged with nitrogen gas, and the mixture was heated and stirred for 15 minutes at 40° C. to dissolve the monomer. Then, s-BPDA (96.1 mol %) was added, and the mixture was further stirred for 30 minutes to obtain a polyamic acid solution. Then, phthalic anhydride (7.8 mol %) was added to the polyamic acid solution to obtain a liquid polyimide precursor resin composition having a viscosity of 3.0 Pa·s (25° C.). This polyimide precursor resin composition was allowed to stand at 25° C. for 30 days, and the viscosity stability was evaluated. The evaluation result was ○ (good).

The prepared polyimide precursor resin composition was spin-coated on a glass substrate, and the coated film was heat-treated at 120° C., 150° C., 200° C., 250° C., and 500° C. for 10 minutes at each temperature to form a polyimide film having a thickness of 10 μm on the glass substrate. No blistering was observed in the obtained polyimide/glass laminate, but the 90° peel strength could not be measured because the polyimide film was very fragile.

Comparative Example 6

PPD (100 mol %) and NMP were charged into a reaction vessel purged with nitrogen gas, and the mixture was heated and stirred for 15 minutes at 40° C. to dissolve the monomer. Then, s-BPDA (92.4 mol %) was added, and the mixture was further stirred for 30 minutes to obtain a polyamic acid solution. Then, phthalic anhydride (13.9 mol %) was added to the polyamic acid solution to obtain a liquid polyimide precursor resin composition having a viscosity of 3.1 Pa·s (25° C.). This polyimide precursor resin composition was allowed to stand at 25° C. for 30 days, and the viscosity stability was evaluated. The evaluation result was ○ (good).

The prepared polyimide precursor resin composition was spin-coated on a glass substrate, and the coated film was heat-treated at 120° C., 150° C., 200° C., 250° C., and 500° C. for 10 minutes at each temperature to form a polyimide film having a thickness of 10 μm on the glass substrate. No blistering was observed in the obtained polyimide/glass laminate, but the 90° peel strength could not be measured because the polyimide film was very fragile.

Example 5

PPD (100 mol %) and NMP were charged into a reaction vessel purged with nitrogen gas, and heated and stirred for 15 minutes at 40° C. to dissolve the monomer. Then, s-BPDA (97 mol %) was added, and the mixture was further stirred for 30 minutes to obtain a polyamic acid solution. Then, phthalic anhydride (3 mol %) was added to the polyamic acid solution to obtain a liquid polyimide precursor resin composition having a viscosity of 1.4 Pa·s (25° C.). This polyimide precursor resin composition was allowed to stand at 25° C. for 30 days, and the viscosity stability was evaluated. The evaluation result was ○ (good).

The prepared polyimide precursor resin composition was spin-coated on a glass substrate, and the coated film was heat-treated at 120° C., 150° C., 200° C., 250° C., and 500° C. for 10 minutes at each temperature to form a polyimide film having a thickness of 10 μm on the glass substrate. No blistering was observed in the obtained polyimide/glass laminate, and the 90° peel strength between the polyimide film and the glass substrate in the laminate was 417 mN/mm.

Example 6

PPD (100 mol %) and NMP were charged into a reaction vessel substituted with nitrogen gas, and the mixture was heated and stirred for 15 minutes at 40° C. to dissolve the monomer. Then, s-BPDA (98 mol %) was added, and the mixture was further stirred for 30 minutes to obtain a polyamic acid solution. Then, PEPA (4 mol %) was added to the polyamic acid solution to obtain a liquid polyimide precursor resin composition having a viscosity of 4.4 Pa·s (25° C.). This polyimide precursor resin composition was allowed to stand at 25° C. for 30 days, and the viscosity stability was evaluated. The evaluation result was ○ (good).

The prepared polyimide precursor resin composition was spin-coated on a glass substrate, and the coated film was heat-treated at 120° C., 150° C., 200° C., 250° C., and 500° C. for 10 minutes at each temperature to form a polyimide film having a thickness of 10 μm on the glass substrate. No blistering was observed in the obtained polyimide/glass laminate, and the 90° peel strength between the polyimide film and the glass substrate of this laminate was 318 mN/mm.

Example 7

PPD (100 mol %) and NMP were charged into a reaction vessel purged with nitrogen gas, and the mixture was heated and stirred for 15 minutes at 40° C. to dissolve the monomer. Then, s-BPDA (99.5 mol %) was added and the mixture was further stirred for 30 minutes to obtain a polyamic acid solution. Then, phthalic anhydride (1 mol %) was added to the polyamic acid solution to obtain a liquid polyimide precursor resin composition having a viscosity of 4.4 Pa·s (25° C.). This polyimide precursor resin composition was allowed to stand at 25° C. for 30 days, and the viscosity stability was evaluated. The evaluation result was ○ (good).

The prepared polyimide precursor resin composition was spin-coated on a glass substrate, and the coated film was heat-treated at 120° C., 150° C., 200° C., 250° C., and 500° C. for 10 minutes at each temperature to form a polyimide film having a thickness of 10 μm on the glass substrate. No blistering was observed in the obtained polyimide/glass laminate, and the 90° peel strength between the polyimide film and the glass substrate in the laminate was 417 mN/mm.

Example 8

ODA (100 mol %) and NMP were charged into a reaction vessel purged with nitrogen gas, and the mixture was heated and stirred for 15 minutes at 40° C. to dissolve the monomer. Then, s-BPDA (98 mol %) was added, and the mixture was further stirred for 30 minutes to obtain a polyamic acid solution. Then, phthalic anhydride (4 mol %) was added to the polyamic acid solution to obtain a liquid polyimide precursor resin composition having a viscosity of 3.3 Pa·s (25° C.). This polyimide precursor resin composition was allowed to stand at 25° C. for 30 days, and the viscosity stability was evaluated. The evaluation result was ○ (good).

The prepared polyimide precursor resin composition was spin-coated on a glass substrate, and the coated film was heat-treated at 120° C., 150° C., 200° C., 250° C., and 400° C. for 10 minutes at each temperature to form a polyimide film having a thickness of 10 μm on the glass substrate. No blistering was observed in the obtained polyimide/glass laminate, and the 90° peel strength between the polyimide film and the glass substrate in the laminate was 608 mN/mm.

Example 9

PPD (50 mol %), ODA (50 mol %) and NMP were charged into a reaction vessel purged with nitrogen gas, and the mixture was heated and stirred for 15 minutes at 40° C. to dissolve the monomer. Then, s-BPDA (39.2 mol %) and PMDA (58.8 mol %) were added, and the mixture was further stirred for 30 minutes to obtain a polyamic acid solution. Then, phthalic anhydride (4 mol %) was added to the polyamic acid solution to obtain a liquid polyimide precursor resin composition having a viscosity of 2.0 Pa·s (25° C.). This polyimide precursor resin composition was allowed to stand at 25° C. for 30 days, and the viscosity stability was evaluated. The evaluation result was ○ (good).

The prepared polyimide precursor resin composition was spin-coated on a glass substrate, and the coated film was heat-treated at 120° C., 150° C., 200° C., 250° C., and 400° C. for 10 minutes at each temperature to form a polyimide film having a thickness of 10 μm on the glass substrate. No blistering was observed in the obtained polyimide/glass laminate, and the 90° peel strength between the polyimide film and the glass substrate in the laminate was 288 mN/mm.

Comparative Example 7

PPD (100 mol %) and NMP were charged into a reaction vessel purged with nitrogen gas, and heated and stirred for 15 minutes at 40° C. to dissolve the monomer. Then, s-BPDA (98 mol %) was added and the mixture was further stirred for 30 minutes to obtain a polyamic acid solution. Then, phthalic anhydride (4.5 mol %) was added to the polyamic acid solution to obtain a liquid polyimide precursor resin composition having a viscosity of 4.4 Pa·s (25° C.). This polyimide precursor resin composition was allowed to stand at 25° C. for 30 days, and the viscosity stability was evaluated. The evaluation result was ○ (good).

The prepared polyimide precursor resin composition was spin-coated on a glass substrate, and the coated film was heat-treated at 120° C., 150° C., 200° C., 250° C., and 500° C. for 10 minutes at each temperature to form a polyimide film having a thickness of 10 μm on the glass substrate. No blistering was observed in the obtained polyimide/glass laminate, but the 90° peel strength could not be measured because the polyimide film was very fragile.

TABLE 1

|  |  | Example 1 | Example 2 | Example 3 | Example 4 | Comparative Example 1 | Comparative Example 2 | Comparative Example 3 | Comparative Example 4 |
|---|---|---|---|---|---|---|---|---|---|
| acid dianhydride (mol %) | s-BPDA | 98 | 98 | 98 | 98 | 100 | 99.5 | 98 | 97 |
|  | PMDA |  |  |  |  |  |  |  |  |
| acid monoanhydride (%) | phthalic anhydride | 2 | 2 | 4 |  |  |  | 8 | 2 |
|  | maleic anhydride |  |  |  | 4 |  |  |  |  |
|  | PEPA |  |  |  |  |  |  |  |  |

TABLE 1-continued

| | | | | | | | | | |
|---|---|---|---|---|---|---|---|---|---|
| diamine (mol %) | PPD | 100 | 100 | 100 | 100 | 100 | 100 | 100 | 100 |
| | ODA | | | | | | | | |
| value of equations (1) | | 0.98 | 0.98 | 0.98 | 0.98 | 1.00 | 0.995 | 0.98 | 0.97 |
| value of equations (2) | | 0.50 | 0.50 | 1.00 | 1.00 | | 0.00 | 2.00 | 0.33 |
| silane coupling agent | | none | none | none | none | none | γ-APS | none | none |
| viscosity stability | | ○ | ○ | ○ | ○ | ○ | x | ○ | ○ |
| material of substrate | | glass | SiOx | glass | glass | silicon | SiOx | glass | glass |
| peel strength (mN/mm) | | 538 | 499 | 512 | 282 | 10 | 4 | The measurement was not possible because the polyimide film was very fragile. | |

| | | Comparative-Example 5 | Comparative-Example 6 | Example 5 | Example 6 | Example 7 | Example 8 | Example 9 | Comparative-Example 7 |
|---|---|---|---|---|---|---|---|---|---|
| acid dianhydride (mol %) | s-BPDA | 96.1 | 92.4 | 97 | 98 | 99.5 | 98 | 39.2 | 98 |
| | PMDA | | | | | | | 58.8 | |
| acid monoanhydride (%) | phthalic anhydride | 7.8 | 13.9 | 3 | | 1 | 4 | 4 | 4.5 |
| | maleic anhydride | | | | | | | | |
| | PEPA | | | | 4 | | | | |
| diamine (mol %) | PPD | 100 | 100 | 100 | 100 | 100 | | 50 | 100 |
| | ODA | | | | | | 100 | 50 | |
| value of equations (1) | | 0.96 | 0.92 | 0.97 | 0.98 | 0.995 | 0.98 | 0.98 | 0.98 |
| value of equations (2) | | 1.00 | 0.91 | 0.50 | 1.00 | 1.00 | 1.00 | 1.00 | 1.13 |
| silane coupling agent | | none | none | none | none | none | none | none | none |
| viscosity stability | | ○ | ○ | ○ | ○ | ○ | ○ | ○ | ○ |
| material of substrate | | glass | glass | glass | glass | glass | glass | glass | glass |
| peel strength (mN/mm) | | The measurement was not possible because the polyimide film was very fragile. | | 417 | 318 | 417 | 608 | 288 | The measurement was not possible. |

INDUSTRIAL APPLICABILITY

The polyimide precursor resin composition of the present invention gives a polyimide film having excellent peel strength to a substrate without containing a silane coupling agent, and can be suitably used as a substrate of flexible devices, for example, display devices such as a liquid crystal display, an organic EL display, or electronic paper, and light receiving devices such as a light receiving element of a thin film solar cell.

The invention claimed is:

1. A method for producing a flexible device substrate, comprising steps of:
   (A) forming a laminate including a carrier substrate and a polyimide film formed thereon, wherein the laminate is formed by casting a polyimide precursor resin composition comprising a polyamic acid on the carrier substrate, and imidizing the polyamic acid by heat treatment to form a polyimide film, wherein
   the polyamic acid has a structure obtained from a tetracarboxylic acid component comprising at least one of 3,3',4,4'-biphenyltetracarboxylic dianhydride and pyromellitic dianhydride; a diamine component comprising at least one of paraphenylenediamine and 4,4'-diaminodiphenyl ether; and a carboxylic acid monoanhydride; wherein the polyamic acid satisfies following equations (1) and (2):

$$0.97 \leq X/Y < 1.00 \quad \text{Equation (1)}$$

$$0.5 \leq (Z/2)/(Y-X) \leq 1.05 \quad \text{Equation (2)}$$

wherein X represents a number of moles of tetracarboxylic acid component, Y represents a number of moles of diamine component, and Z represents a number of moles of the carboxylic acid monoanhydride, wherein a peel strength between the carrier substance and the polyimide film is 300 mN/mm or more;
   (B) forming an inorganic film on the polyimide film; and
   (C) separating the polyimide film from the carrier substrate to form a flexible device substrate including the polyimide film,
   wherein the steps are performed in an order of (A), (B), and (C).

2. The method for producing a flexible device substrate according to claim 1, wherein the inorganic film comprises an inorganic material selected from the group consisting of silicon nitride, silicon oxide, silicon oxynitride, aluminum oxide, titanium oxide, and zirconium oxide.

3. The method for producing a flexible device substrate according to claim 1, further comprising (D) forming a TFT, wherein the steps are performed in an order of (A), (B), (D), and (C).

4. The method for producing a flexible device substrate according to claim 1, wherein the carrier substrate is selected from a glass substrate and a metal substrate.

5. The method for producing a flexible device substrate according to claim 1, wherein a content of 3,3',4,4'-biphenyltetracarboxylic dianhydride is 40 mol % or more in the tetracarboxylic acid component.

6. The method for producing a flexible device substrate according to claim 1, wherein a content of paraphenylenediamine is 40 mol % or more in the diamine component.

7. The method for producing a flexible device substrate according to claim 1, wherein the carboxylic acid monoanhydride is phthalic anhydride or maleic anhydride.

8. A method for manufacturing a flexible device, comprising: manufacturing the flexible device substrate according to claim 1; and forming a circuit on the flexible device substrate.

* * * * *